United States Patent
Wutte

(10) Patent No.: US 9,525,058 B2
(45) Date of Patent: Dec. 20, 2016

(54) INTEGRATED CIRCUIT AND METHOD OF MANUFACTURING AN INTEGRATED CIRCUIT

(71) Applicant: Infineon Technologies Austria AG, Villach (AT)

(72) Inventor: Britta Wutte, Feistritz (AT)

(73) Assignee: Infineon Technologies Austria AG, Villach (AT)

( * ) Notice: Subject to any disclaimer, the term of this patent is extended or adjusted under 35 U.S.C. 154(b) by 121 days.

(21) Appl. No.: 14/066,976

(22) Filed: Oct. 30, 2013

(65) Prior Publication Data
US 2015/0115351 A1    Apr. 30, 2015

(51) Int. Cl.
*H01L 29/66*    (2006.01)
*H01L 29/78*    (2006.01)
(Continued)

(52) U.S. Cl.
CPC ....... *H01L 29/7813* (2013.01); *H01L 29/1095* (2013.01); *H01L 29/407* (2013.01);
(Continued)

(58) Field of Classification Search
CPC .............. H01L 27/249; H01L 27/0679; H01L 27/0727; H01L 29/7827; H01L 29/66734; H01L 29/7804; H01L 29/7806; H01L 29/8707; H01L 29/7802; H01L 29/7805; H01L 29/7807; H01L 29/7808; H01L 29/7813; H01L 29/7815; H01L 29/1095; H01L 29/407; H01L 29/41766
(Continued)

(56) References Cited

U.S. PATENT DOCUMENTS 5,929,690 A * 7/1999 Williams ............ H01L 27/0248
                                                    257/E29.064
7,982,265 B2 * 7/2011 Challa ................. H01L 21/3065
                                                              257/331
(Continued)

FOREIGN PATENT DOCUMENTS

WO            9423457 A1    10/1994

OTHER PUBLICATIONS

Ahlers, et al. "Gated Diode, Battery Charging Assembly and Generator Assembly." U.S. Appl. No. 13/484,340, filed May 31, 2012.
Meiser, et al. "Semiconductor Device, Method of Manufacturing a Semiconductor Device and Integrated Circuit." U.S. Appl. No. 13/902,151, filed May 24, 2013.

*Primary Examiner* — Tucker J Wright
*Assistant Examiner* — Stephen C Smith
(74) *Attorney, Agent, or Firm* — Murphy, Bilak & Homiller, PLLC

(57) ABSTRACT

An integrated circuit includes a power component including a plurality of first trenches in a cell array and a first conductive material in the first trenches electrically coupled to a gate terminal of the power component, and a diode component including a first diode device trench and a second diode device trench disposed adjacent to each other. A second conductive material in the first and the second diode device trenches is electrically coupled to a source terminal of the diode component. The first trenches, the first diode device trench and the second diode device trench are disposed in a first main surface of a semiconductor substrate. The integrated circuit further includes a diode gate contact including a connection structure between the first and the second diode device trenches. The connection structure is in contact with the second conductive material in the first and the second diode device trenches.

14 Claims, 10 Drawing Sheets

(51) Int. Cl.
  *H01L 29/10* (2006.01)
  *H01L 29/40* (2006.01)
  *H01L 29/417* (2006.01)
(52) U.S. Cl.
  CPC .. *H01L 29/41766* (2013.01); *H01L 29/66734* (2013.01); *H01L 29/7805* (2013.01); *H01L 29/7815* (2013.01); *H01L 29/7802* (2013.01)
(58) Field of Classification Search
  USPC .......................................................... 257/328
  See application file for complete search history.

(56) References Cited

U.S. PATENT DOCUMENTS

| | | | | |
|---|---|---|---|---|
| 8,772,861 B2* | 7/2014 | Zundel | ................ | H01L 27/0255 257/328 |
| 2003/0080355 A1* | 5/2003 | Shirai | ................ | H01L 29/0696 257/200 |
| 2011/0291186 A1* | 12/2011 | Yilmaz | ............... | H01L 29/4236 257/334 |
| 2013/0214378 A1* | 8/2013 | Shirai | ................... | H01L 29/475 257/476 |

* cited by examiner

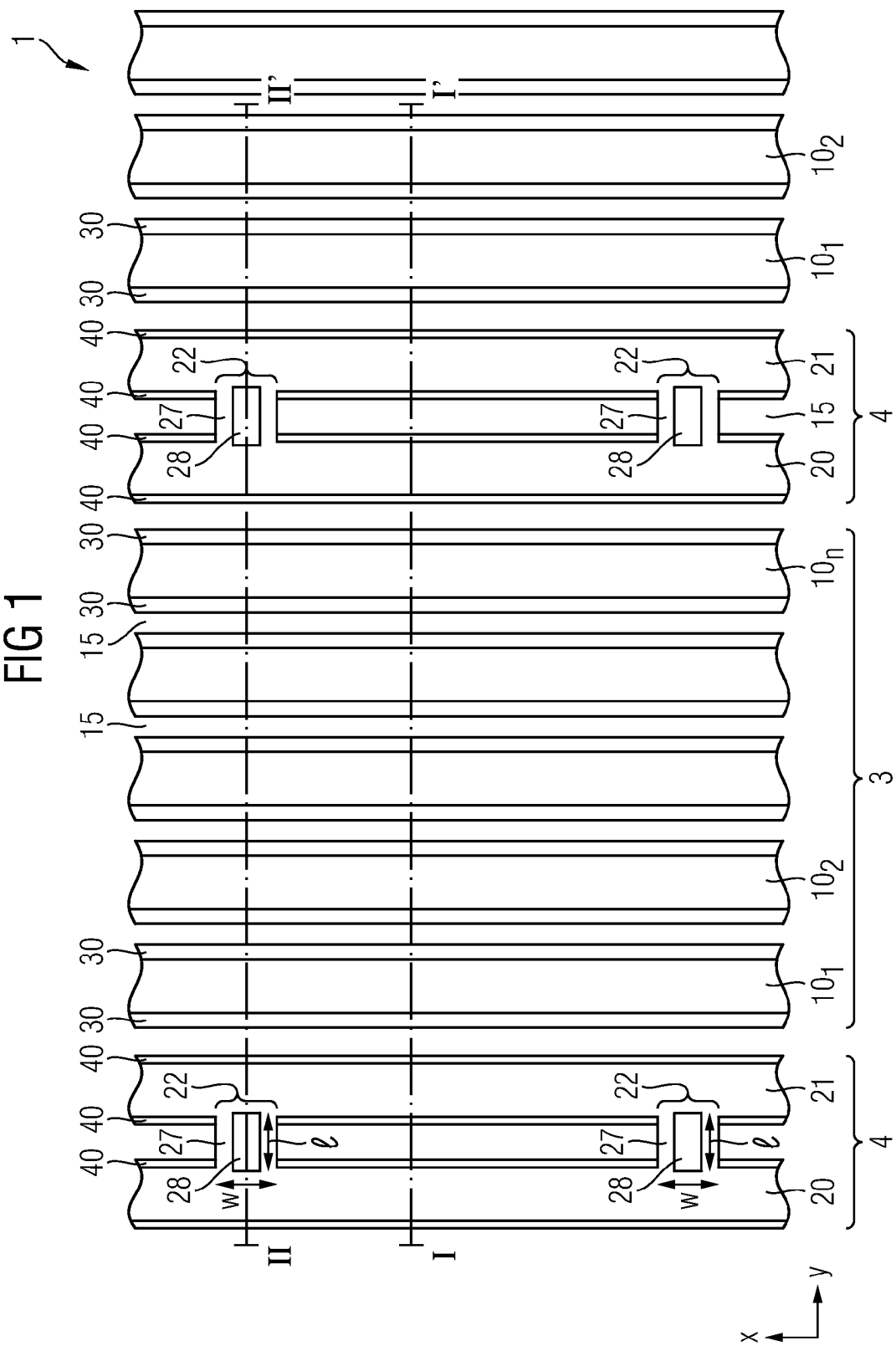

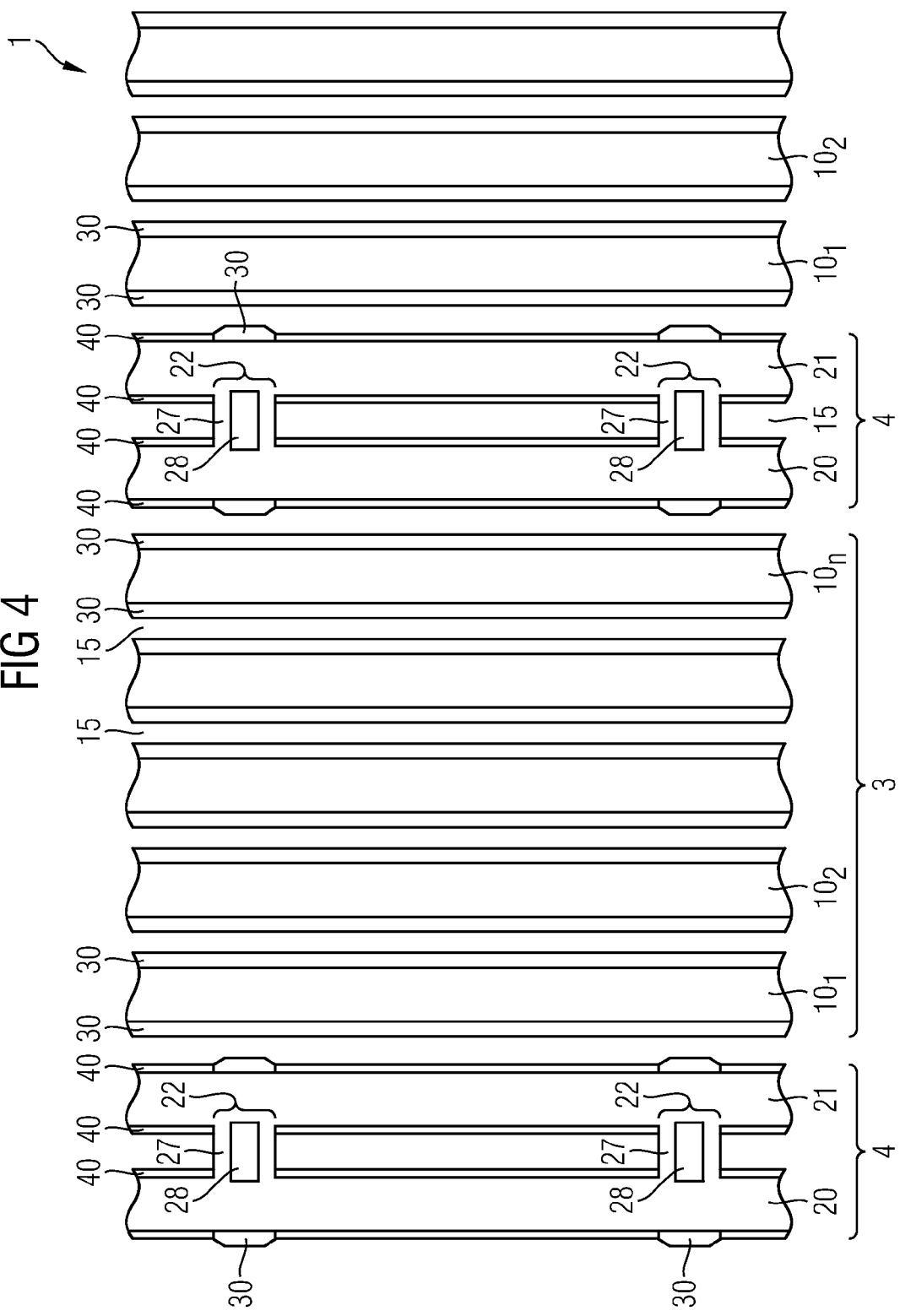

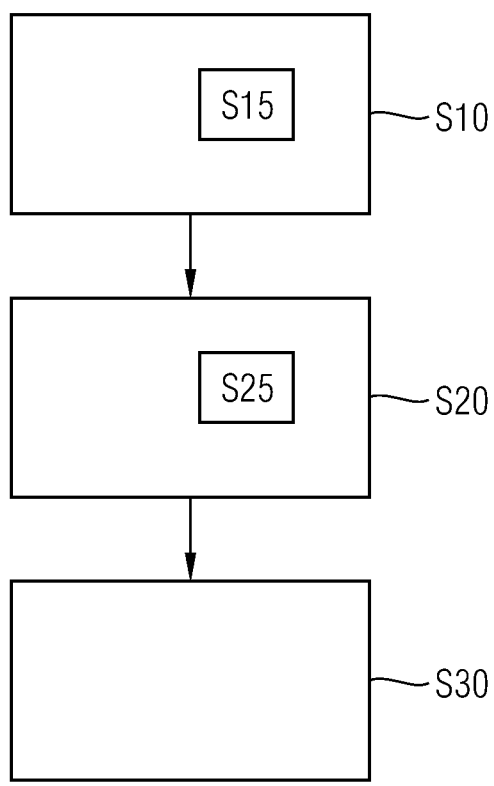

US 9,525,058 B2

INTEGRATED CIRCUIT AND METHOD OF MANUFACTURING AN INTEGRATED CIRCUIT

BACKGROUND

In the field of automotive applications and automotive circuitry, standard pn diodes are used for rectifying a voltage generated by an electric generator. Due to this rectification, power losses take place. The power losses are given by the product of the forward voltage and the average current generated by the electric generator. Due to the largely increased need of electrical current, the electric generator is one of the greatest sources of power losses in a car. In order to reduce these losses, efficient diodes, so-called high efficiency diodes are being searched for. One possibility of reducing the power losses is by reducing the forward voltage.

A further demand to be met by generator diodes is the breakdown voltage in the case of a load dump. In order to protect electric components in the car, the diodes have to dissipate the entire energy generated by the electric generator in a certain voltage window.

SUMMARY

According to an embodiment, an integrated circuit comprises a power component including a plurality of first trenches in a cell array and a first conductive material in the first trenches electrically coupled to a gate terminal of the power component, and a diode component including a first diode device trench and a second diode device trench disposed adjacent to each other. A second conductive material in the first and the second diode device trenches is electrically coupled to a source terminal of the diode component. The first trenches, the first diode device trench and the second diode device trench are disposed in a first main surface of a semiconductor substrate. The integrated circuit further comprises a diode gate contact including a connection structure between the first and the second diode device trenches, the connection structure being in contact with the second conductive material in the first and the second diode device trenches.

According to a further embodiment, an integrated circuit comprises a power component including a plurality of first trenches in a cell array. A first conductive material in the first trenches is coupled to a gate terminal of the power component. The integrated circuit further comprises a diode component including a diode device trench and a second conductive material in the diode device trench coupled to a source terminal of the diode component. The first trenches and the diode device trench are disposed in a first main surface of a semiconductor substrate. The first conductive material and the second conductive material are disposed at the first main surface of the semiconductor substrate.

According to an embodiment, a method of manufacturing an integrated circuit comprises forming a power component including a plurality of first trenches in a cell array, including forming the first trenches in a first main surface of a semiconductor substrate and forming a first conductive material in the first trenches. The method further comprises forming a diode component including a first diode device trench and a second diode device trench disposed adjacent to each other, including forming the first diode device trench and the second diode device trench in the first main surface of the semiconductor substrate and forming a second conductive material in the first and the second diode device trenches. The method further comprises forming a diode gate contact including a trench connection structure in a trench portion between the first and the second diode device trenches, so as to be in contact with the second conductive material in the first diode device trench and the second diode device trench, electrically coupling the first conductive material in the first trenches with a gate terminal of the power component, and electrically coupling the second conductive material in the first and the second diode device trenches with a source terminal of the diode component.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIG. 1 shows a cross-sectional view parallel to a first main surface of a semiconductor substrate of an integrated circuit according to an embodiment;

FIG. 4 is a cross-sectional view of an integrated circuit according to a further embodiment;

FIG. 6 shows a flowchart illustrating steps of a method of manufacturing the integrated circuit.

DETAILED DESCRIPTION

Figure 2A:
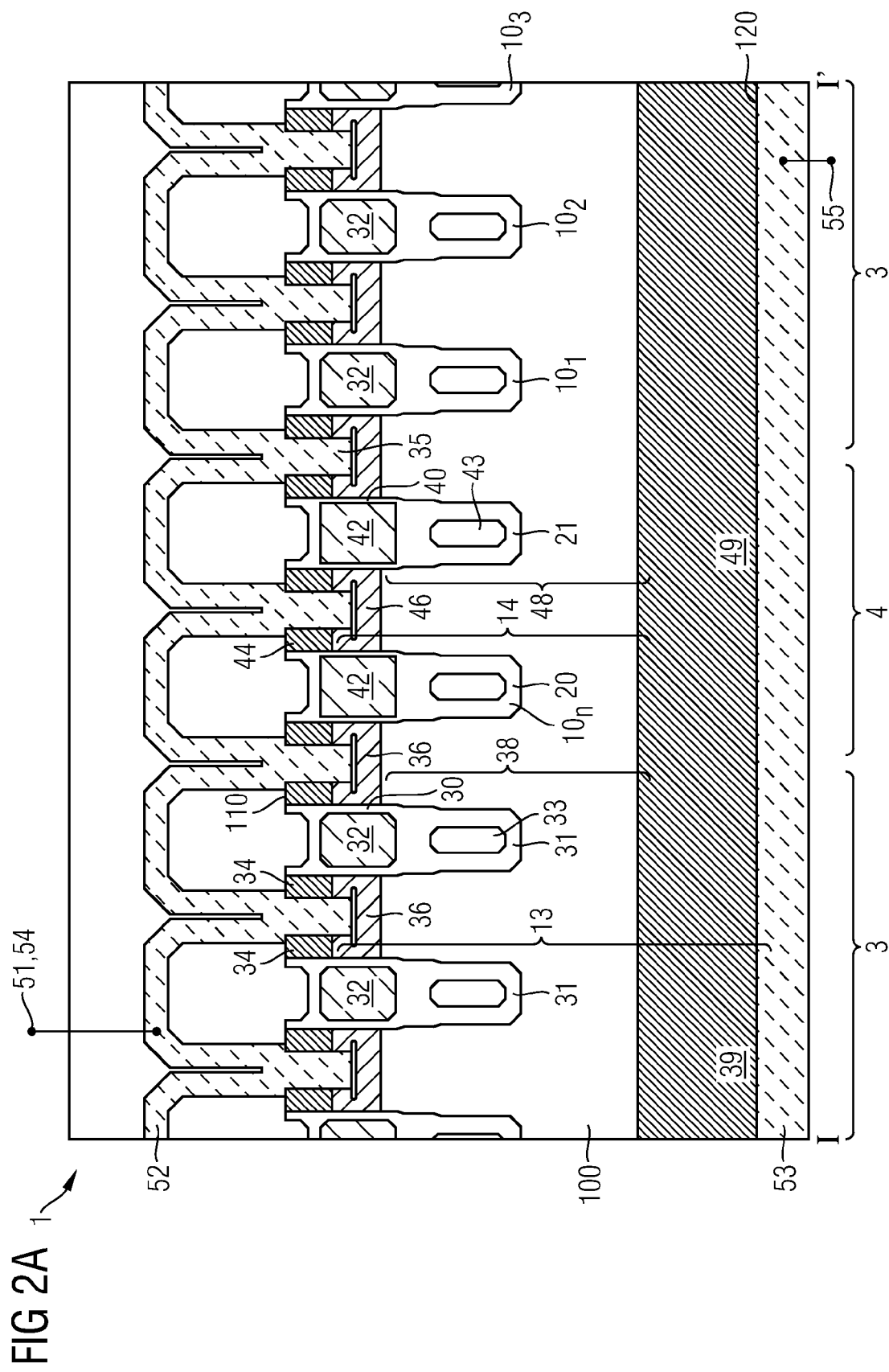
FIGS. 2A, 2B and 2C are cross-sectional views of an integrated circuit according to embodiments, the cross-sectional views being taken at different positions.

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The Figures and the description illustrate relative doping concentrations by indicating "−" or "+" next to the doping type "n" or "p". For example, "n⁻" means a doping concentration which is lower than the doping concentration of an "n"-doping region while an "n⁺"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

FIG. 1 illustrates a cross-sectional view of an integrated circuit 1 according to an embodiment. The cross-sectional view of FIG. 1 is taken parallel to a first main surface of a semiconductor substrate. The integrated circuit 1 of FIG. 1 comprises a power component 3 and a diode component 4. The power component 3 comprises a plurality of power transistor cells that are connected parallel to each other. The power component 3 includes a plurality of first trenches $10_1, \ldots 10_n$ that may be arranged so as to run parallel and at the same distance to each other in the x direction, i.e. the direction from top to the bottom of the drawings. A first gate electrode 32 is arranged in the plurality of first trenches $10_1, \ldots, 10_n$. Mesas 15 are disposed between adjacent trenches. As will be further explained below, components of the power transistor cells 13 are disposed within the mesas 15 and in the semiconductor substrate material below the depicted cross-sectional view.

The integrated circuit 1 further comprises a diode component 4 which is integrated into the cell array of the power component. For example, the diode component 4 may comprise a first diode device trench 20 and a second diode device trench 21. As will be illustrated herein below with reference to FIG. 2A, a second gate electrode 42 is arranged in the first and second diode device trenches 20, 21.

According to an embodiment, diode gate contacts 22 are in contact with the second gate electrode 42 that is arranged in the first and second diode device trenches 20, 21. For example, the diode gate contact 22 may comprise a contact pad 28 that runs in a direction intersecting the first direction, for example the y direction. Further, the diode gate contact 22 may comprise a connection structure 27 that connects the first and the second diode device trenches 20, 21. For example, the connection structure 27 may include a trench portion that is arranged between the first and the second diode device trenches. The trench portion may extend in a direction intersecting the first direction, for example, the y direction. According to a further embodiment, the connection structure 27 may be implemented by a conductive material that is disposed over the first main surface. The conductive material is disposed between adjacent diode device trenches 20, 21.

A plurality of diode gate contacts 22 may be disposed in the integrated circuit 1 including an array of power transistor cells and gate-controlled diode devices. According to an embodiment, the first and second diode device trenches 20, 21 may have the same width as the first trenches $10_1, \ldots, 10_n$. According to an embodiment, the distance between any of the first trenches $10_1, 10_2$ may be equal to the distance between a diode device trench and an adjacent first trench. According to an embodiment, the first trenches and the diode device trenches may be arranged at the same pitch. The first and the second diode device trenches 21, 20, are disposed adjacent to each other. For example, the pitch may denote a distance between adjacent trenches, the pitch being measured from a middle position of each trench. According to an embodiment, the first trenches and the diode device trenches may be arranged at the same pitch, and the width of the first trenches and the width of the diode device trenches may be slightly different. Further, the width of the mesa, i.e. the semiconductor material between adjacent trenches may be slightly different, and the first trenches and the diode device trenches are arranged at the same pitch.

FIG. 2A shows a cross-sectional view of the integrated circuit between I and I' as is also illustrated in FIG. 1. The cross-sectional view of FIG. 2A is taken along the y direction. The integrated circuit 1 comprises a power component 3 and a diode component 4. The power component 3 includes a plurality of trenches $10_1, \ldots 10_n$. Each of the single transistors 13 of the power component includes a first source region 34, a first drain region 39, a first body region 36, and a first drift zone 38. The first source region 34 is disposed adjacent to the first main surface 110 of the semiconductor substrate 100. The first drain region 39 may be disposed adjacent to the second main surface which is opposite to the first main surface 110. The first body region 36 and the first drift zone 38 extend perpendicularly with respect to the first main surface 110. The first body region 36 and the first drift zone 38 are arranged between the first source region 34 and the first drain region 39. The first gate electrode 32 is disposed in the first trenches $10_1, \ldots 10_n$. The first gate electrode 32 is insulated from the first body region 36 by means of a first gate dielectric 30. The transistor 13 may further comprise a first field plate 33 that is disposed adjacent to the first drift zone 38. The first field plate 33 is insulated from the first drift zone 38 by means of a first field dielectric layer 31.

The first source region 34 and the first drain region 39 may be doped with dopants of the first conductivity type, for example n type. The body region 36 may be doped with dopants of the second conductivity type, for example p type. The first drift zone 38 may be doped with dopants of the first conductivity type at a lower doping concentration than the first source region 34 and the first drain region 39. When a suitable gate voltage is applied to the first gate electrode 32, a conductive inversion layer is formed at the boundary between the first body region 36 and the first gate dielectric 30. Accordingly, the transistor is in a conducting state from the first source region 34 to the first drain region 39 via the conductive inversion channel and the first drift zone 38.

The conductivity of the channel that is formed in the first body region 36 is controlled by the first gate electrode 32. By controlling the conductivity of the channel, the current flow from the first source region 34 via the channel formed in the body region 36 and the drift zone 38 to the first drain region 39 may be controlled.

In case of switching-off, no conductive channel is formed at the boundary between the first body region 36 and the first gate dielectric 30, so that no current flows. Further, an appropriate voltage may be applied to the first field plate in an off-state. For example, the first field plate 33 may be connected with a first source terminal 51 which is also connected with the first source region 34. In an off-state, the field plate 33 depletes charge carriers from the first drift zone so that the breakdown voltage characteristics of the transistor 200 are improved. In the transistor 13 comprising a first field plate 33 the doping concentration of the drift zone 38 may be increased without deteriorating the breakdown voltage characteristics in comparison to a device without a field plate. Due to the higher doping concentration of the first drift zone 38, the on-resistance $RDS_{on}$ is further decreased resulting in improved device characteristics.

The transistors 13 further include a body contact portion 35. The body contact portion 35 electrically connects the channel region to the first source region 34 and suppresses or deteriorates a parasitic bipolar transistor. The body contact portion 35 may form part of a metallization layer 52 that is formed over the transistor cell array.

The power component 3 includes a plurality of transistors 13 connected in parallel. The first source regions 34 of the power component 3 may be coupled to a first source terminal 51. The first drain region 39 may be coupled to a first drain terminal 53.

The integrated circuit 1 further comprises a diode component 4 including a first diode device trench 20 and a second diode device trench 21. The diode component 4 comprises gate-controlled diode devices 14 having a similar construction as the power transistor 13 of the power component so that a detailed description thereof will be omitted for the sake of convenience. The gate-controlled diode devices 14 of the diode component comprise a second source region 44, a second body region 46, a second drift zone 48 and a second drain region 49. The second source region may be coupled to a second source terminal. According to the embodiment of FIG. 2A, the first and the second drain region are electrically connected and are formed as one single doped portion adjacent to the second main surface 120. The semiconductor device comprises a first metallization layer 52 in contact with the first main surface 110. The first metallization layer 52 may be electrically coupled to the first source regions 34 and the second source region 44. The semiconductor device further comprises a second metallization layer 53 in contact with the second main surface 120.

A second gate electrode 42 is disposed in the first and the second diode device trenches 20, 21. The second gate electrode 42 is insulated from the second source region 46 by means of a second gate dielectric 40. According to an embodiment, the thickness of the second gate dielectric 40 may be equal to the thickness of the first gate dielectric 30. According to a further embodiment, the thickness of the second gate dielectric 40 may be smaller than the thickness of the first gate dielectric layer 30. The second source region 44 is electrically connected to the second body region 46 by means of the body contact portion 35.

Figure 2B:
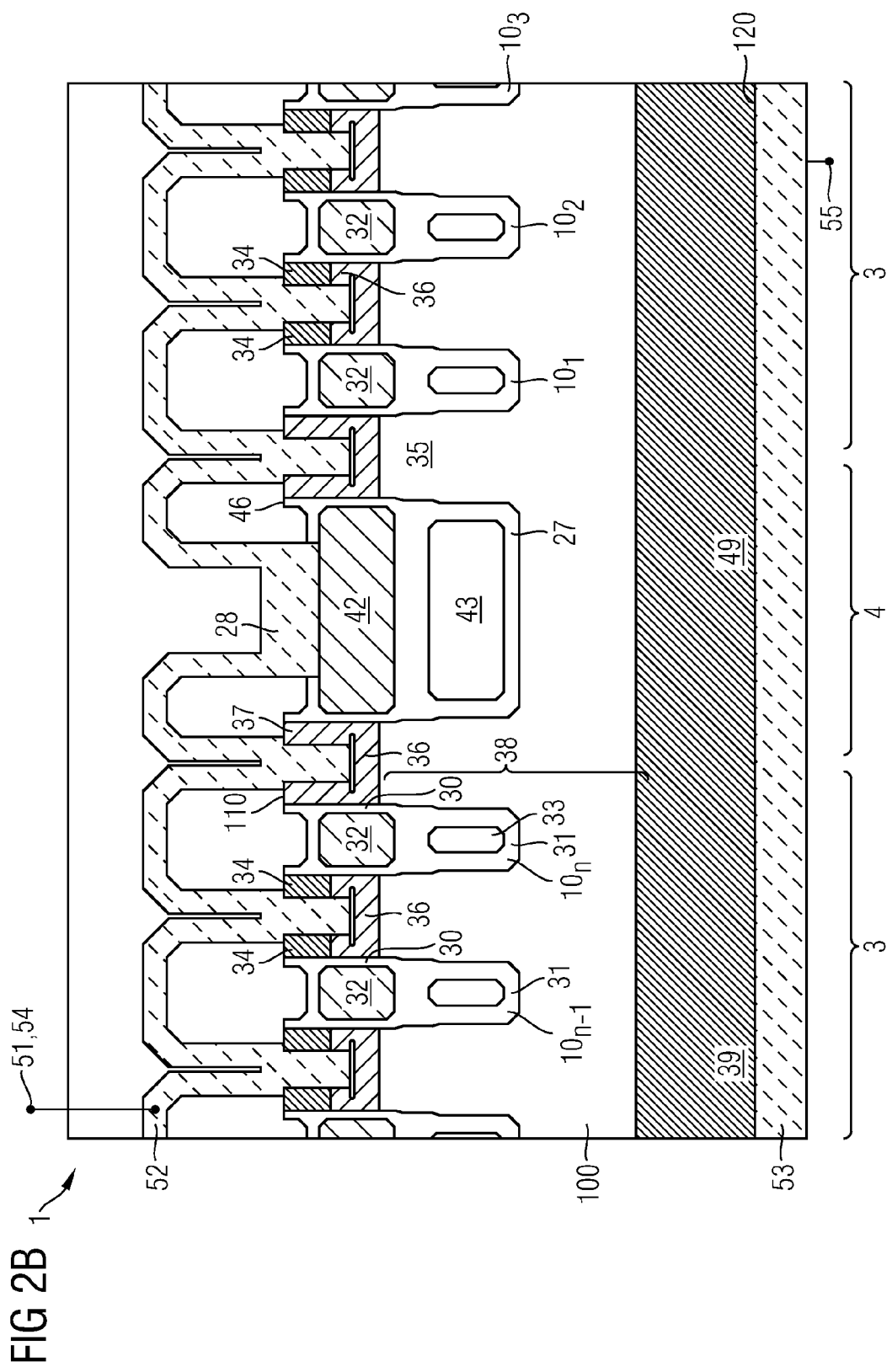

FIG. 2B shows a cross-sectional view between II and II' at a portion intersecting the connection structure 27. According to the embodiment shown in FIG. 2B, the connection structure 27 is implemented as a trench connection structure 27 that includes a trench portion. The trench portion connects the first and the second diode device trenches 20, 21. The trench portion may extend in a direction perpendicularly to the first and the second diode device trenches 20, 21. The diode gate contact 22 may comprise the trench connection structure 27 and the contact pad 28. The diode gate contact 22 is a component of the diode component 4. The diode gate contact 22 is disposed so as to be connected with two adjacent second gate electrodes 42 that are disposed in adjacent diode device trenches 20, 21, respectively. The diode gate contact may be coupled to a second source terminal 54 via the contact pad 28. Further, the second drain region 49 may be coupled to a second drain terminal 55.

According to the embodiment of FIG. 2B, the diode component 4 comprises an inactive portion at the trench connection structure 27. For example, when forming the source regions for the power component 3 and the diode component 4, no source region is formed at a portion adjacent to the trench connection structure 27. As is illustrated in FIG. 2B, an inactive portion 37 is disposed at portions of the substrate adjacent to the first main surface in a region adjacent to the trench connection structure 27. In a plane before and behind the depicted plane of the drawing, i.e. in regions in which the trench connection structure 27 is not present, second source regions are disposed adjacent to the first and the second diode device trenches 20, 21. Further, the thickness of the dielectric material between the gate electrode 42 and the adjacent body region 46 is larger than the thickness of the second gate dielectric layer 40 shown in FIG. 2A. In other words, the dielectric material is locally thinned to form the gate dielectric layer 40 of the diode device, and the dielectric material is not thinned at a portion adjacent to the trench connection structure 27.

Figure 2C:
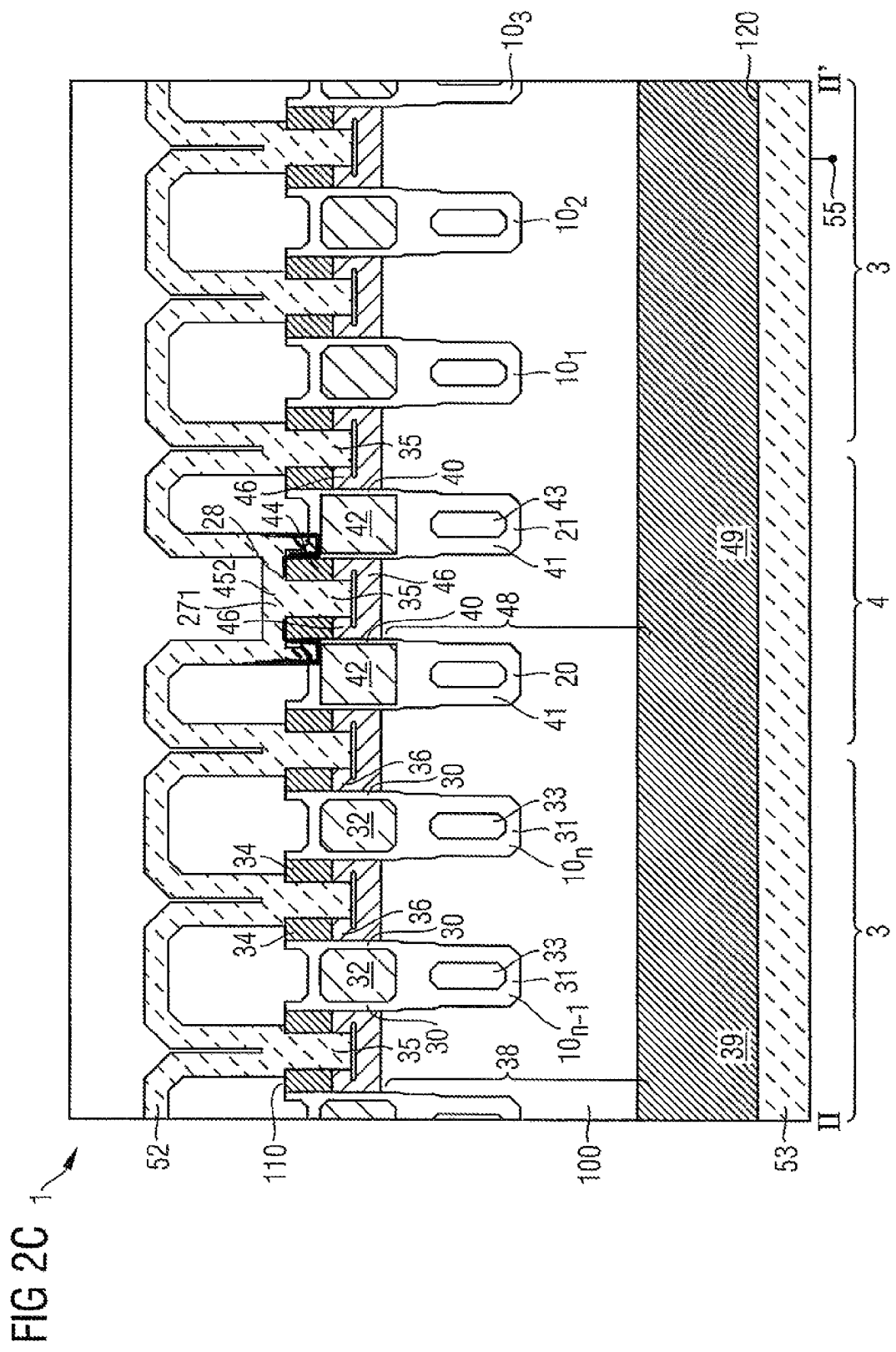

FIG. 2C shows a cross-sectional view of the integrated circuit between II and II' according to a further embodiment, at a portion intersecting the connection structure 271. According to the embodiment, the connection structure 271 is not implemented as a trench connection structure. In other words, the connection structure 271 does not include a trench connecting the first and the second diode device trenches 20, 21. The connection structure includes a contact pad 28 comprising a conductive material 452 disposed over the first main surface 110 of the semiconductor substrate 100. The conductive material 452 is arranged so as to contact the second gate electrodes and the second source regions 44. Further, the conductive material 452 is in contact with the body region 46 to form a body contact region 35. According to the embodiment shown in FIG. 2C, there are no inactive portions 37 adjacent to the connection structure 271. Further, the second gate dielectric 40 is present at a region of the connection structure 271.

Figure 3:
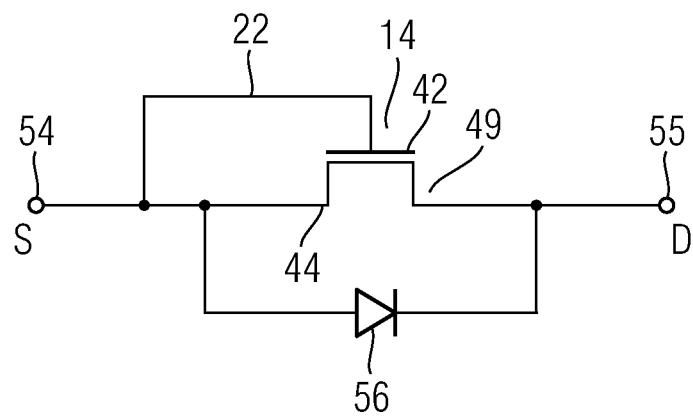
FIG. 3 is an equivalent circuit diagram of the semiconductor device forming part of an integrated circuit according to an embodiment.

FIG. 3 shows an equivalent circuit diagram of a gate-controlled diode device or MOS gated diode 14. The gate-controlled diode device 14 includes a transistor comprising a second source region 44, a second drain region 49 and a second gate electrode 42. A second source terminal 54 is connected with the second source region 44. A second drain terminal 55 is connected with the second drain region 49. A current between the second source region 44 and the second drain region 49 is controlled by the second gate electrode 42. The second gate electrode 42 is connected with the second source terminal 54 by means of the diode gate contact 22. As has been discussed above, the transistor is implemented by a MOSFET ("metal oxide semiconductor field effect transistor"). Accordingly, the gate electrode 42 is disposed adjacent to the semiconductor body (not shown in FIG. 3), the second gate electrode 42 being insulated from the second body region by a second gate dielectric (not shown in FIG. 3). When a voltage larger than a threshold voltage is applied to the second gate electrode 42, a conductive channel is formed between the second source region 44 and the second drain region 49 and the transistor is in a conductive state. At a gate voltage smaller than the threshold voltage, a sub-threshold current, which is dominated by diffusion, flows. By controlling the gate voltage, the current from the second source region 44 to the second drain region 49 via the second body region can be controlled. By setting the thickness of the second gate dielectric, the threshold voltage of the transistor may be adjusted. For example, by decreasing the thickness of the second gate dielectric, the threshold voltage of the transistor may be decreased.

Due to the presence of the body contact region 35, the second source terminal 54 is further connected via a diode 56 to the second drain terminal 55. When a voltage larger than a forward voltage is applied to the diode 56 in an appropriate polarity, a current flows from the source terminal 54 to the second drain terminal 55. At a voltage smaller than the forward voltage, no current flows. When a reverse voltage is applied to the diode 56, a current flow is blocked and no current flows from the second drain to the second source terminal.

According to the configuration shown in FIG. 3, since the second source terminal 54 is also connected with the second gate electrode 42, a current flows from the second source terminal 54 to the second drain terminal 55 even when a voltage smaller than the forward voltage is applied between the source terminal 54 and the second drain terminal 55.

According to the configuration described hereinabove, the integrated circuit 1 may comprise a power component 3 and a diode component 4 in which the trenches of the diode component 4 are integrated with the trenches of the power component 3. Due to the specific implementation of the diode gate contact 22, the first trenches $10_1, \ldots 10_n$ and the diode device trenches 20, 21 may have the same width and the same pitch. In particular, since the diode gate contact 22 comprises a connection structure 27, 271 extending between two adjacent trenches, a good contact between the diode gate contact 22 and the conductive material may be accomplished even though the width of the diode device trenches 20, 21 is decreased. The width of the diode device trenches 20, 21 may be decreased so as to be equal to the width of the first trenches $10_1, \ldots 10_n$. As a result, the pitch of the first trenches and the diode device trenches can be further decreased resulting in an increased transistor density. Since the diode gate contact 22 comprises a connection structure 27, 271 extending between two adjacent diode device trenches 20, 21, the placement of the contact pad 28 is further simplified. Since the width of the diode device trenches 20, 21 may be equal to width of the first trenches $10_1, \ldots 10_n$, no separate masks for forming the diode device trenches are necessary which further simplifies the manufacturing process.

According to the embodiment illustrated in FIGS. 1, 2A and 2C, the second gate dielectric layer 40 may be continuously disposed adjacent to the sidewall of the diode device trenches 20, 21. According to the embodiment shown in FIGS. 2B and 4, the second gate dielectric layer 40 is interrupted at the diode gate contact portions so that this portion of the diode device trench does not act as a diode device. At the diode gate contact portions the second gate dielectric layer 40 is interrupted and the thicker first gate dielectric layer 30 is present. According to a further embodiment, parts of the mesa may be modified so that they do not act as a second source region. For example, no second source region may be formed at the diode gate contact portions.

According to the embodiment shown in FIGS. 1 to 4, the length l of the diode gate contacts 22 and of the contact pads 28 may be selected larger than the width of the diode device trenches 20, 21, the length l and the width being measured in a direction perpendicularly with respect to the first direction. Further, the width w of the connection structure 27, 271 measured along the first direction may be larger than the width of the diode device trenches 20, 21. As a consequence, a contact resistance of the diode gate contact may be decreased. Further, the landing of the contact pad 28 on the connection structure 27, 271 is made easier, thus improving the reliability and the performance of the manufacturing process. According to an embodiment, the width w of the connection structure 27, 271 is selected in dependence from the width of the contact pad 28, so that the landing of the contact pad 28 on the connection structure 27, 271 is made easier.

Figure 5A:
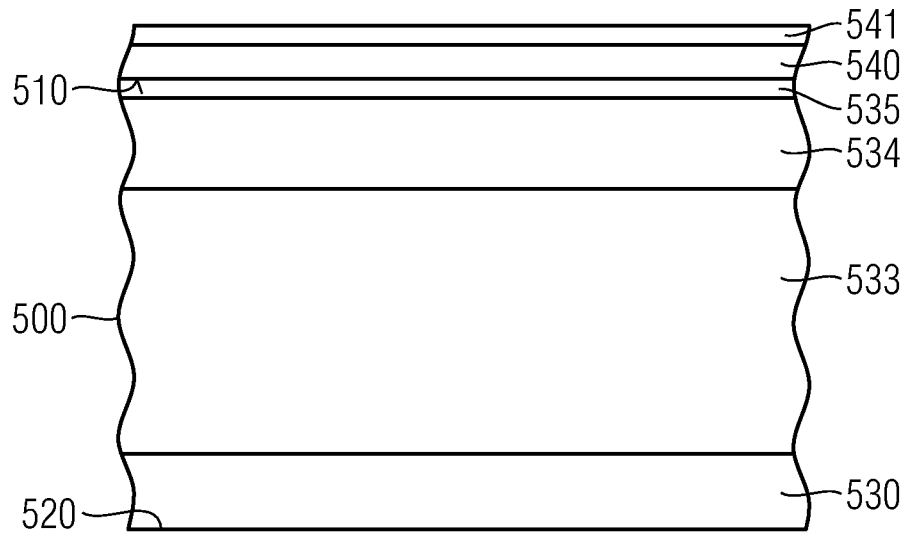
FIGS. 5A to 5F illustrate a method of forming an integrated circuit according to an embodiment.

According to an embodiment, the diode gate contact 22 or the contact pad does not extend beyond the outer sidewall of the first diode device trench 20 or the second diode device trench 21. For example, the length of the contact pad forming the diode gate contact 22 may be smaller than a distance between outer sidewalls of the first diode device trench 20 and the second diode device trench 21. As a consequence, the diode gate contact does not cross the mesa which forms part of the power component 3. FIGS. 5A to 5F illustrate a method of manufacturing an integrated circuit according to an embodiment. Starting point may be a semiconductor substrate 500 having a first main surface 510 and a second main surface 520, the second main surface 520 being opposite to the first main surface 510. For example, the semiconductor substrate 500 may be doped with a first conductivity type, and further doped portions 533, 534, 535 may be formed in the semiconductor substrate. For example, the layer 530 may be $n^+$-doped, the layer 533 may be $n^-$-doped, the layer 534 may be p-doped and the layer 535 may be $n^+$-doped. As is clearly to be understood, any of these conductivity types may be reversed. A hard mask layer 540 is formed on the first main surface 510 of the semiconductor substrate 500, followed by a photoresist layer 541. FIG. 5A shows a cross-sectional view of an example of a substrate between II and II'.

Thereafter, trenches may be defined in the first main surface 510 of the semiconductor substrate 500. For example, a photoresist mask and, optionally, a hard mask may be generated using a photolithographic process. The photoresist mask may include openings corresponding to the first trenches, the first and the second diode device trenches.

Further, the photoresist mask may include openings corresponding to the trench connection structure 27.

Figure 5B:
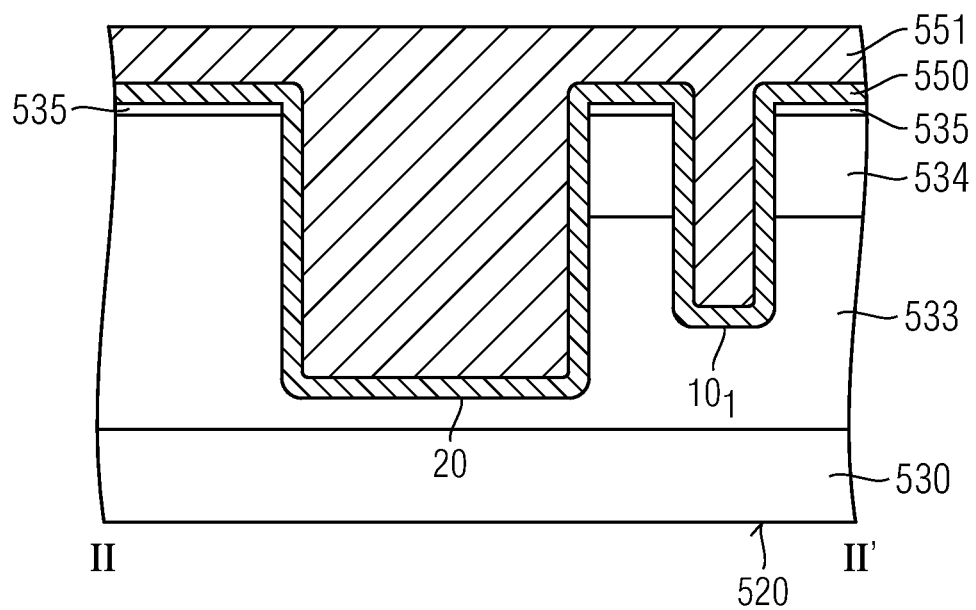

FIG. 5B shows an example in which a trench connection structure 27 and a first trench 10₁ of the power component 3 are formed in the first main surface 510. The diode device trenches 20, 21 and the first trench 10₁ may be identical to each other in a cross-sectional view before and behind the depicted plane of the drawing. For example, they may have the same width and the same depth with respect to each other. As is to be clearly understood, further diode device trenches and further power trenches may be formed in the semiconductor substrate.

According to a different embodiment, the diode device trenches 20, 21 may be formed without forming a dedicated trench connection structure 27. According to this embodiment, the connection structure may be implemented as illustrated in FIG. 2C, for example. In this case, the first trenches 10₁, . . . 10ₙ, and the first and second diode device trenches 20, 21 may be formed in an identical manner with respect to each other. For example, the first trenches, the first and the second diode device trenches may be formed in the manner as is described with reference to FIGS. 5A to 5F.

A first dielectric layer forming the field dielectric layer 550 is formed on the trench sidewalls, followed by a conductive layer 551 such as a polysilicon layer for forming the field plate. FIG. 5B shows an example of a resulting structure.

Figure 5C:
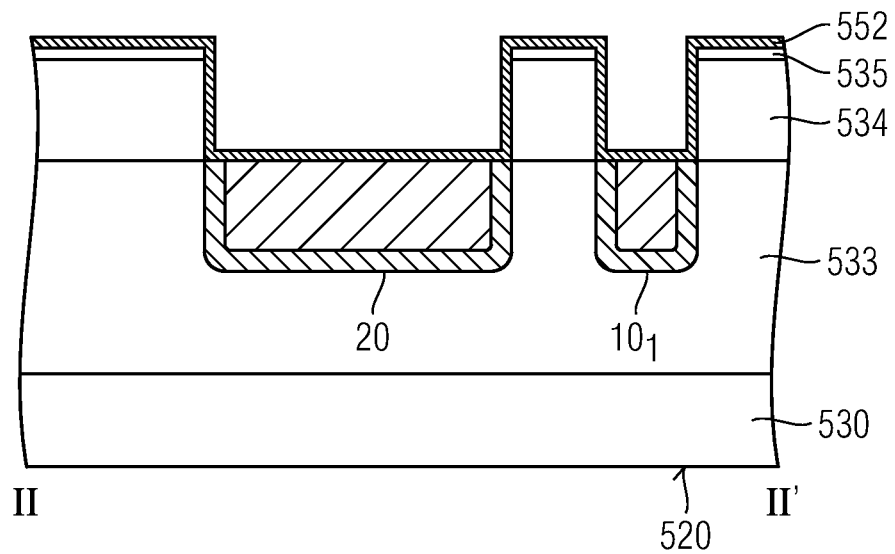

Thereafter, the first conductive layer 551 is etched back, followed by etching the first dielectric layer 550. Since two diode device trenches 20, 21 are present in a plane before and behind the depicted plane of the drawing, etching the first conductive layer may be performed without using a dedicated mask for the diode component 4. Then, a second dielectric layer 552 which may form the gate dielectric layer in the first trench 10₁ is formed over the entire semiconductor substrate. FIG. 5C shows an example of a resulting structure.

Figure 5D:
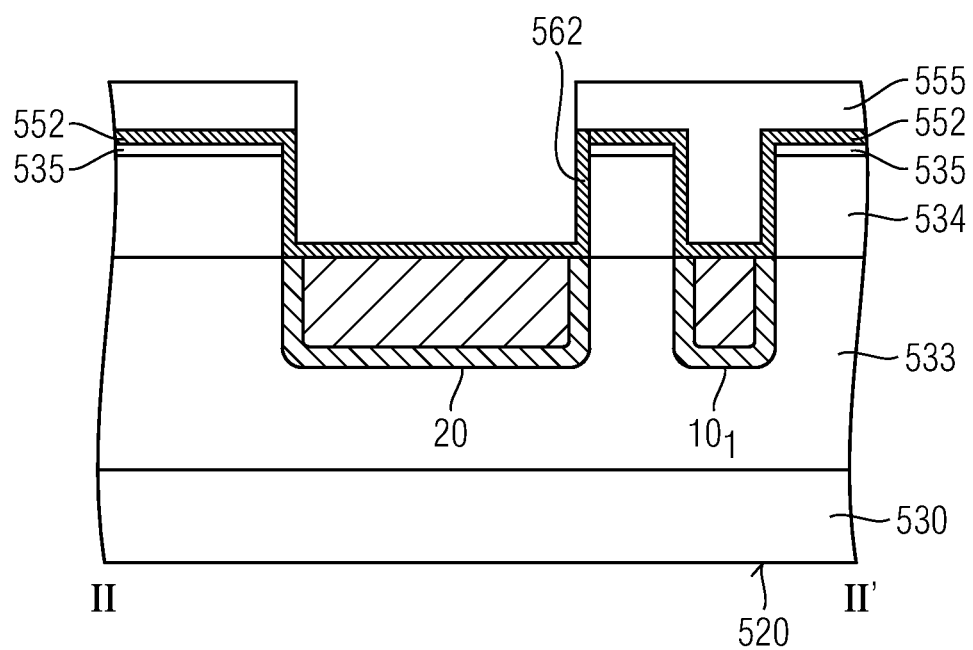

According to an embodiment, the second dielectric layer 552 may be removed from the diode device trench 20. For example, this may be accomplished using an appropriate photomask 555. Thereafter, a further oxidation step may be performed so as to form a second gate dielectric layer 562 in the diode device trench 20. According to this embodiment, the thickness of the second gate dielectric layer 562 may be smaller than the thickness of the second dielectric layer 552 which will form the first gate dielectric layer. FIG. 5D shows an example of a resulting structure.

According to a further embodiment, the second dielectric layer 552 may also form the second gate dielectric layer 562 present in the diode device trenches.

Figure 5E:
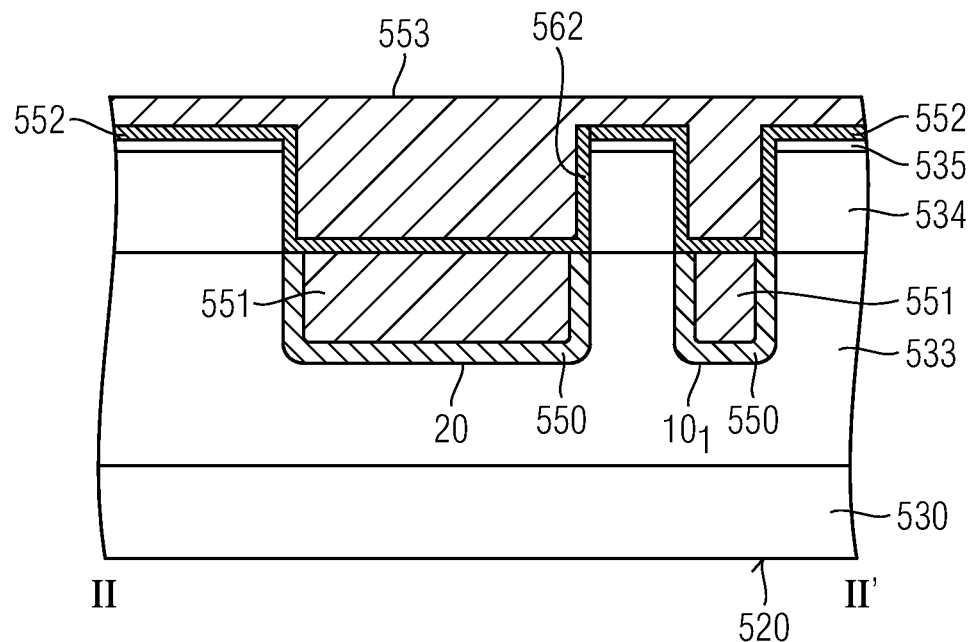

Thereafter, a second conductive layer 553 is formed over the surface. The second conductive layer 553 may comprise doped polysilicon. FIG. 5E shows an example of the resulting structure.

Then, the second conductive layer 553 may be removed from portions of the semiconductor substrate in such a manner that the second conductive layer 553 remains between a first diode device trench 20 and a second diode device trench (not shown in this drawing). For example, this may be accomplished using a CMP (chemical mechanical polishing) method or an etching method.

Figure 5F:
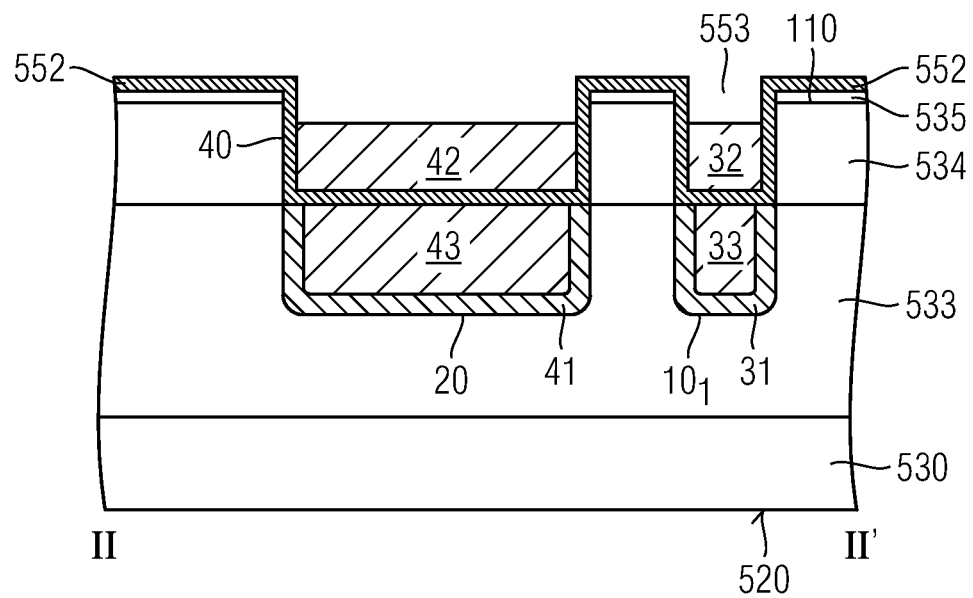

According to an embodiment, the second conductive layer 553 may be etched so that a surface of the resulting conductive filling is below the first main surface 110 of the semiconductor substrate 100. A cross-sectional view of an example of a resulting structure is shown in FIG. 5F. Thereby, a topology is created. In other words, the resulting surface includes recesses that may be used to form contacts in a self-aligned manner. To further process the diode contacts 22, a further insulating layer 556 (as illustrated in FIGS. 2B, 2C) may be formed over the resulting surface. Contact openings are defined, followed by forming a conductive layer. As a result, contacts pads 28 are formed. As a result the diode contacts 22 including the contact pads 28 are in contact with the second conductive layer 553.

As has been shown in the foregoing, an integrated circuit 1 comprising a power component 3 and a diode component 4 may be manufactured in an easy manner using the standard processes for manufacturing a power device. In particular, the integrated circuit may be manufactured so that the trenches for the power component and the diode component may have the same width and the same pitch. Hence, the first conductive layer 551 which is removed from the top most portion of the diode device trenches and the power transistor trenches 10₁, . . . , 10ₙ, may be etched back without using a dedicated etching mask for the diode device trenches and the power transistor trenches, respectively. As a consequence, the manufacturing process is further simplified. Further, contact openings for forming the body contact regions may be formed in a self-aligned manner, as has been discussed above. In the context of the present specification, the term "in a self-aligned manner" is intended to mean that the contacts are etched using an etching mask that has been defined by patterns formed before.

As has been described, contacts to the diode component 4 may be accomplished using a trench connection structure in a further trench portion between diode device trenches. According to an embodiment, the further trench portion, the first trenches, the first and the second diode device trenches may be formed using joint or common processing methods.

FIG. 6 summarizes a method of manufacturing an integrated circuit according to an embodiment. As is shown, a method of manufacturing an integrated circuit comprises forming a power component including a plurality of first trenches in a cell array (S10), a first conductive material in the first trenches being electrically coupled to a gate terminal of the power component, including forming the first trenches in a first main surface of a semiconductor substrate (S15), forming a diode component including a first diode device trench and a second diode device trench disposed adjacent to each other (S20), including forming the first diode device trench and the second diode device trench in the first main surface of the semiconductor substrate (S25), a second conductive material in the first and the second diode device trenches being electrically coupled to a source terminal of the diode component, and forming a diode gate contact in contact with a conductive material in the first diode device trench and the second diode device trench (S30), including forming a trench connection structure in a trench portion arranged between the first and the second diode device trenches.

While embodiments of the invention have been described above, it is obvious that further embodiments may be implemented. For example, further embodiments may comprise any subcombination of features recited in the claims or any subcombination of elements described in the examples given above. Accordingly, this spirit and scope of the appended claims should not be limited to the description of the embodiments contained herein.

What is claimed is:

1. An integrated circuit, comprising:
a power component including a plurality of first trenches in a cell array and a first conductive material in the first trenches electrically coupled to a gate terminal of the power component;
a diode component including a first diode device trench and a second diode device trench disposed adjacent to each other, and a second conductive material in the first and the second diode device trenches electrically coupled to a source terminal of the diode component, the first trenches, the first diode device trench and the second diode device trench being disposed in a first main surface of a semiconductor substrate; and
a diode gate contact including a connection structure between the first and the second diode device trenches, the connection structure directly adjacent to the second conductive material in the first and the second diode device trenches,
wherein the plurality of first trenches, the first diode device trench and the second diode device trench run in a first direction,
wherein the connection structure runs in a second direction intersecting the first direction,
wherein the second direction is parallel to the first main surface.

2. The integrated circuit according to claim 1, wherein the connection structure is a trench connection structure disposed in a further trench portion between the first and the second diode device trenches, the further trench portion being disposed in the first main surface of the semiconductor substrate.

3. The integrated circuit according to claim 1, wherein the power component comprises power transistor cells including a first source region, a first drain region, and a first body region, the first conductive material in the first trenches implementing a first gate electrode adjacent to the first body region.

4. The integrated circuit according to claim 3, wherein the diode component comprises a gate-controlled diode device including a second source region, a second drain region, and a second body region, the second conductive material in the first and the second diode device trenches implementing a second gate electrode, the second source region being coupled to the source terminal of the diode component.

5. The integrated circuit according to claim 4, wherein the diode component further comprises a second gate dielectric disposed between the second gate electrode and the second body region, a thickness of the second gate dielectric being smaller than a thickness of a first gate dielectric between the first gate electrode and the first body region.

6. The integrated circuit according to claim 1, wherein a width of the connection structure measured along the first direction is larger than a width of the first diode device trench and the second diode device trench measured along the second direction.

7. The integrated circuit according to claim 1, wherein the first and the second diode device trenches are arranged at the same pitch as the plurality of first trenches.

8. An integrated circuit, comprising:
a power component including a plurality of first trenches in a cell array and a first conductive material in the first trenches coupled to a gate terminal of the power component;
a diode component including a first diode device trench and a second diode device trench disposed adjacent to each other, a second conductive material in the first and the second diode device trenches coupled to a source terminal of the diode component, the first and the second diode device trenches being disposed in a first main surface of a semiconductor substrate, the first and second diode device trenches running in a first direction; and
a diode gate contact including a connection structure between the first and the second diode device trenches, the connection structure being in contact with the second conductive material in the first diode device trench and in the second diode device trench and comprising a trench connection structure disposed in a further trench portion between the first and the second diode device trenches, the further trench portion being disposed in the first main surface of the semiconductor substrate and running in a second direction parallel to the first main surface and intersecting the first direction.

9. The integrated circuit according to claim 8, wherein the plurality of first trenches run in the first direction.

10. The integrated circuit according to claim 8, wherein the power component comprises power transistor cells including a first source region, a first drain region, and a first body region, the first conductive material in the first trenches implementing a first gate electrode adjacent to the first body region.

11. The integrated circuit according to claim 8, wherein the diode component comprises a gate-controlled diode device including a second source region, a second drain region, and a second body region, the second conductive material in the first and the second diode device trenches implementing a second gate electrode, the second source region being coupled to the source terminal of the diode component.

12. The integrated circuit according to claim 8, wherein the connection structure includes conductive material disposed over the first main surface, the connection structure being disposed between the first and the second diode device trenches.

13. The integrated circuit according to claim 8, wherein a width of the connection structure measured along the first direction is larger than a width of the first diode device trench and the second diode device trench measured along the second direction.

14. The integrated circuit according to claim 8, wherein the first and the second diode device trenches are arranged at the same pitch as the plurality of first trenches.

* * * * *